(12) United States Patent
Kikuchi et al.

(10) Patent No.: US 11,205,729 B2
(45) Date of Patent: Dec. 21, 2021

(54) SEMICONDUCTOR DEVICE AND METHOD FOR MANUFACTURING SAME

(71) Applicant: Sharp Kabushiki Kaisha, Osaka (JP)

(72) Inventors: Tetsuo Kikuchi, Sakai (JP); Masahiko Suzuki, Sakai (JP); Setsuji Nishimiya, Sakai (JP); Teruyuki Ueda, Sakai (JP); Masamitsu Yamanaka, Sakai (JP); Tohru Daitoh, Sakai (JP); Hajime Imai, Sakai (JP); Kengo Hara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 2 days.

(21) Appl. No.: 16/293,900

(22) Filed: Mar. 6, 2019

(65) Prior Publication Data
US 2019/0280126 A1    Sep. 12, 2019

(30) Foreign Application Priority Data

Mar. 7, 2018 (JP) .............................. JP2018-040615

(51) Int. Cl.
*H01L 29/10* (2006.01)
*H01L 29/786* (2006.01)
(Continued)

(52) U.S. Cl.
CPC ........ *H01L 29/7869* (2013.01); *G02F 1/1368* (2013.01); *H01L 21/02565* (2013.01);
(Continued)

(58) Field of Classification Search
CPC ............. G02F 1/1368; H01L 21/02565; H01L 21/30604; H01L 29/41733; H01L 29/66969; H01L 29/7869
See application file for complete search history.

(56) References Cited

U.S. PATENT DOCUMENTS 7,071,037 B2 * 7/2006 Suzawa ................... H01L 29/06
257/E21.414
8,253,138 B2 * 8/2012 Yamazaki ............... H01L 29/04
257/59
(Continued)

FOREIGN PATENT DOCUMENTS

JP    2008-032899 A    2/2008
JP    2010-008758 A    1/2010
(Continued)

OTHER PUBLICATIONS

Li et al., "Dual Active Layer Structure of Nitrogen Doped Amorphous InSnZnO Thin-Film Transistors for Negative Gate Bias Stability Improvement," SID 2016 Digest (2016) pp. 1186-1188.*
(Continued)

*Primary Examiner* — Jay C Kim
(74) *Attorney, Agent, or Firm* — Keating & Bennett, LLP

(57) ABSTRACT

A semiconductor device includes a thin film transistor, wherein: a semiconductor layer of the thin film transistor has a layered structure including a lower oxide semiconductor layer including In, Ga, Zn and Sn and an upper oxide semiconductor layer arranged on the lower oxide semiconductor layer and including In, Ga and Zn; a thickness of the lower oxide semiconductor layer is 20 nm or less; an atomic ratio of Sn with respect to all metal elements of the lower oxide semiconductor layer is 5% or more; the upper oxide semiconductor layer includes no Sn, or an atomic ratio of Sn with respect to all metal elements of the upper oxide semiconductor layer is smaller than an atomic ratio of Sn with respect to all metal elements of the lower oxide semiconductor layer; and a first angle $\theta 1$ between a side surface and a lower surface of the lower oxide semiconductor layer is smaller than a second angle $\theta 2$ between a side
(Continued)

surface and a lower surface of the upper oxide semiconductor layer.

7 Claims, 8 Drawing Sheets

(51) Int. Cl.
    *H01L 29/417*     (2006.01)
    *G02F 1/1368*     (2006.01)
    *H01L 21/02*     (2006.01)
    *H01L 21/306*     (2006.01)
    *H01L 29/66*     (2006.01)
    *H01L 27/12*     (2006.01)

(52) U.S. Cl.
    CPC .. *H01L 21/30604* (2013.01); *H01L 29/41733* (2013.01); *H01L 29/66969* (2013.01); *H01L 29/78696* (2013.01); *H01L 27/1225* (2013.01); *H01L 27/1248* (2013.01)

(56) References Cited

U.S. PATENT DOCUMENTS

| | | | | |
|---|---|---|---|---|
| 8,343,799 | B2 * | 1/2013 | Ito | H01L 27/1214 438/104 |
| 8,890,152 | B2 * | 11/2014 | Yamazaki | H01L 29/24 257/59 |
| 8,912,537 | B2 * | 12/2014 | Wakana | H01L 29/7869 257/43 |
| 9,082,863 | B2 * | 7/2015 | Yamazaki | H01L 29/78693 |
| 9,087,726 | B2 * | 7/2015 | Sato | H01L 27/1225 |
| 9,202,926 | B2 * | 12/2015 | Kishi | H01L 21/02554 |
| 9,209,306 | B2 * | 12/2015 | Uemura | G02F 1/133602 |
| 9,263,531 | B2 * | 2/2016 | Yamazaki | H01L 21/02472 |
| 9,269,821 | B2 * | 2/2016 | Yamazaki | H01L 29/78696 |
| 9,305,940 | B2 * | 4/2016 | Kim | H01L 21/32134 |
| 9,362,313 | B2 * | 6/2016 | Morita | H01L 29/7869 |
| 9,437,744 | B2 * | 9/2016 | Sasagawa | H01L 29/78696 |
| 9,490,268 | B2 * | 11/2016 | Yamazaki | H01L 29/4908 |
| 9,502,242 | B2 * | 11/2016 | Won | C23C 16/45574 |
| 9,576,984 | B1 * | 2/2017 | Shih | H01L 27/1218 |
| 9,647,133 | B2 * | 5/2017 | Pham | H01L 23/3171 |
| 9,673,048 | B2 * | 6/2017 | Ono | H01L 21/02592 |
| 9,673,232 | B2 * | 6/2017 | Tsumura | H01L 29/66969 |
| 9,722,049 | B2 * | 8/2017 | Lee | H01L 29/7869 |
| 9,812,583 | B2 * | 11/2017 | Sato | H01L 21/02422 |
| 10,930,790 | B2 * | 2/2021 | Kim | H01L 29/7869 |
| 2008/0024416 | A1 | 1/2008 | Onogi et al. | |
| 2009/0323005 | A1 | 12/2009 | Ota | |
| 2012/0138922 | A1 | 6/2012 | Yamazaki et al. | |
| 2013/0280859 | A1 * | 10/2013 | Kim | H01L 29/78696 438/104 |
| 2013/0320334 | A1 | 12/2013 | Yamazaki et al. | |
| 2014/0138674 | A1 | 5/2014 | Sato et al. | |
| 2014/0286076 | A1 | 9/2014 | Aoki et al. | |
| 2015/0108467 | A1 | 4/2015 | Moriguchi et al. | |
| 2015/0108473 | A1 | 4/2015 | Nakazawa et al. | |
| 2016/0329217 | A1 | 11/2016 | Shigeta et al. | |
| 2018/0151595 | A1 | 5/2018 | Saitoh et al. | |
| 2019/0051758 | A1 | 2/2019 | Ochi et al. | |

FOREIGN PATENT DOCUMENTS

| | | | | |
|---|---|---|---|---|
| JP | 2012-134475 | A | 7/2012 | |
| JP | 2014-007399 | A | 1/2014 | |
| JP | 2014-116588 | A | 6/2014 | |
| JP | 2014-209727 | A | 11/2014 | |
| JP | 2015-109424 | A | 6/2015 | |
| JP | WO 2016/199680 | * | 12/2016 | ........... H01L 29/786 |
| JP | 2017-157813 | A | 9/2017 | |
| WO | 2012/086513 | A1 | 6/2012 | |
| WO | 2015/104962 | A1 | 7/2015 | |
| WO | 2016/199680 | A1 | 12/2016 | |

OTHER PUBLICATIONS

Avis et al., "Effect Of Channel Layer Thickness On The Performance of Indium-Zinc-Tin Oxide Thin Film Transistors Manufactured By Inkjet Printing," ACS Applied Materials Interfaces 6 (2014) pp. 10941-10945.*
Faber et al., "Heterojunction oxide thin-film transistors with unprecedented electron mobility grown from solution," Scientific Advance 3 (2017) e 1602640.*
Yamazaki, "New crystalline structure yields reliable thin-film transistors," SPIE (2012).*
Li et al., "Indium-Gallium-Zinc-Oxide Thin-Film Transistors Based on Homojunctioned Structure Fabricated With a Self-Aligned Process,"Journal of Display Technology 11 (2015) pp. 589-595.*
Deng et al., "Investigation of High-Performance ITO-Stabilized ZnO TFTs With Hybrid-Phase Microstructural Channels." IEEE Transactions on Electron Devices (2017).*
Cong et al., "High-Performance Al—Sn—Zn—O Thin-Film Transistor With a Quasi-Double-Channel Structure," IEEE Electron Device Letters 37 (2016) pp. 53-56.*
Choi et al., "InZnO/AlSnZnInO Bilayer Oxide Thin-Film Transistors With High Mobility and High Uniformity," IEEE Electron Device Letters 37 (2016) pp. 1295-1298.*
Seo et al., "Improved Electrical Performance and Bias Stability of Solution-Processed Active Bilayer Structure of Indium Zinc Oxide based TFT," Applied Materials & Interfaces s 6 (2014) p. 15335-15343.*
Rim et al., "Boost Up Mobility of Solution-Processed Metal Oxide Thin-Film Transistors via Confining Structure on Electron Pathways," Advanced Materials 26 (2014) pp. 4273-4278.*
Kugimiya et al., "High Mobility Oxide Semiconducting Material", Feature : Electronic and Electric technologies (Advanced Materials and Apparatuses), Kobe Steel Technical Report, vol. 65, No. 2, Sep. 2015, pp. 67-71.

* cited by examiner

SEMICONDUCTOR DEVICE AND METHOD FOR MANUFACTURING SAME

BACKGROUND

1. Technical Field

The present invention relates to a semiconductor device formed by using an oxide semiconductor, and a method for manufacturing the same.

2. Description of the Related Art

An active matrix substrate used in a liquid crystal display device, or the like, includes a switching element such as a thin film transistor (hereinafter "TFT") for each pixel. Conventionally, as such TFTs (hereinafter, "pixel TFTs"), TFTs using an amorphous silicon film as the active layer (hereinafter, "amorphous silicon TFTs") and TFTs using a polycrystalline silicon film as the active layer (hereinafter, "polycrystalline silicon TFTs") have been widely used.

On the other hand, techniques are known in the art for monolithically (integrally) providing peripheral circuits such as driving circuits on the substrate. By monolithically forming driving circuits, it is possible to reduce the width of the non-display region and to reduce the cost by simplifying the mounting step. In the present specification, TFTs used in a peripheral circuit monolithically formed on an active matrix substrate are referred to as "circuit TFTs".

An oxide semiconductor is used in some cases, instead of an amorphous silicon or a polycrystalline silicon, as the material of the active layer of a TFT. Such a TFT is referred to as an "oxide semiconductor TFT". An oxide semiconductor has a higher mobility than an amorphous silicon. Therefore, an oxide semiconductor TFT is capable of operating at a higher speed than an amorphous silicon TFT. Therefore, an oxide semiconductor TFT can suitably be used not only as a pixel TFT but also as a circuit TFT.

A ternary oxide (In—Ga—Zn—O-based semiconductor) including In (indium), Ga (gallium) and Zn (zinc), for example, is known as an oxide material used in the active layer of an oxide semiconductor TFT.

In recent years, in order to achieve a higher definition, a lower power consumption, a higher frequency driving (e.g., 120 Hz), etc., of an active matrix substrate, there is a demand for further improving the channel mobility of an oxide semiconductor TFT. In view of this, it has been proposed to use an oxide semiconductor material that may have a higher mobility than an In—Ga—Zn—O-based semiconductor (hereinafter, a "high mobility material"). For example, Japanese Laid-Open Patent Publication No. 2017-157813 (hereinafter, "Patent Document No. 1") discloses a quaternary oxide including In, Ga, Zn and Sn (tin) (In—Ga—Zn—Sn—O-based semiconductor) as a high mobility material. Kobe Steel Technical Report Vol. 65 No. 2 (September 2015), p 67-p 71 (hereinafter, "Non-Patent Document No. 1") mentions high mobility materials such as an In—Sn—Zn—O-based semiconductor and a Zn—Sn—O-based semiconductor.

Note that in the present specification, the mobility (channel mobility) of a portion of the active layer (oxide semiconductor layer) of an oxide semiconductor TFT that is to be a channel may be referred to as the "TFT mobility", as distinguished from the mobility of an oxide semiconductor material itself.

SUMMARY

With an oxide semiconductor TFT, moisture, hydrogen, etc., may enter the oxide semiconductor layer, which is the active layer, from the vicinity thereof, thereby increasing the oxygen defect of the oxide semiconductor, resulting in deterioration such as a decrease in the electric resistance. Therefore, normally, a protection film such as a passivation film is formed so as to cover the oxide semiconductor TFT.

A study by the present inventors revealed that deterioration due to moisture, hydrogen, etc., entering is more likely to occur with oxide semiconductor materials having higher mobilities. For example, when a high mobility material such as an In—Ga—Zn—Sn—O-based semiconductor disclosed in Patent Document No. 1, etc., is used in an oxide semiconductor layer, it is likely that moisture, hydrogen, etc., enter the oxide semiconductor layer, lowering the resistance of the oxide semiconductor layer, and shifting the threshold voltage Vth of the oxide semiconductor TFT toward the negative side. As a result, this may increase the off-leak current, electrically connect between the source and the drain, or cause depletion (normally on state). When an oxide semiconductor TFT is used as a pixel TFT, this may cause a bright spot defect, where the pixel is always at its maximum pixel value. When used as a circuit TFT, this may cause an operational defect of a circuit such as a gate drive circuit.

As described above, it is conventionally difficult to increase the channel mobility while suppressing a decrease in the reliability of the oxide semiconductor TFT.

An embodiment of the present invention has been made in view of the circumstances described above, and it is an object thereof to provide a semiconductor device including oxide semiconductor TFTs that can have a high mobility and a high reliability.

A semiconductor device according to one embodiment of the present invention includes: a substrate; a thin film transistor supported on the substrate, the thin film transistor including a semiconductor layer, a gate electrode, a gate insulating layer formed between the gate electrode and the semiconductor layer, and a source electrode and a drain electrode electrically connected to the semiconductor layer; and an insulating layer covering the semiconductor layer or the thin film transistor, wherein: the semiconductor layer has a layered structure including: a lower oxide semiconductor layer including In, Ga, Zn and Sn; and an upper oxide semiconductor layer arranged on the lower oxide semiconductor layer and including In, Ga and Zn; a thickness of the lower oxide semiconductor layer is 20 nm or less; an atomic ratio of Sn with respect to all metal elements of the lower oxide semiconductor layer is 5% or more; the upper oxide semiconductor layer includes no Sn, or an atomic ratio of Sn with respect to all metal elements of the upper oxide semiconductor layer is smaller than an atomic ratio of Sn with respect to all metal elements of the lower oxide semiconductor layer; and a first angle θ1 between a side surface and a lower surface of the lower oxide semiconductor layer is smaller than a second angle θ2 between a side surface and a lower surface of the upper oxide semiconductor layer.

In one embodiment, a thickness of the lower oxide semiconductor layer is smaller than a thickness of the upper oxide semiconductor layer.

In one embodiment, the upper oxide semiconductor layer includes substantially no Sn.

In one embodiment, the first angle θ1 is 10° or less.

In one embodiment, the second angle θ2 is greater than 10° and 70° or less.

In one embodiment, an angle T is greater than 10° and 30° or less, wherein the angle T is an angle defined between a virtual surface that connects together an upper surface circumference of the semiconductor layer and a lower surface circumference of the semiconductor layer, and a lower surface of the semiconductor layer, along a cross section perpendicular to the substrate.

In one embodiment, the upper oxide semiconductor layer includes a plurality of layers having different composition ratios.

In one embodiment, the gate electrode is arranged on one side of the semiconductor layer that is closer to the substrate, with the gate insulating layer interposed therebetween.

In one embodiment, the gate electrode is arranged on an opposite side of the semiconductor layer away from the substrate, with the gate insulating layer interposed therebetween.

In one embodiment, the source electrode and the drain electrode have a layered structure including a molybdenum layer and a copper layer arranged on the molybdenum layer, wherein the molybdenum layer is in contact with an upper surface of the gate insulating layer and an upper layer of the semiconductor layer.

In one embodiment, the lower oxide semiconductor layer includes an In—Ga—Zn—Sn—O-based semiconductor.

In one embodiment, the upper oxide semiconductor layer includes an In—Ga—Zn—O-based semiconductor.

In one embodiment, the In—Ga—Zn—O-based semiconductor includes a crystalline portion.

A method for manufacturing a semiconductor device according to one embodiment of the present invention is a method for manufacturing a semiconductor device including a substrate and a thin film transistor supported on the substrate, wherein the thin film transistor includes a semiconductor layer, a gate electrode, a gate insulating layer formed between the gate electrode and the semiconductor layer, and a source electrode and a drain electrode electrically connected to the semiconductor layer, the manufacturing method including: a first oxide semiconductor film formation step (A) of forming a first oxide semiconductor film including In, Ga, Zn and Sn, wherein an atomic ratio of Sn with respect to all metal elements of the first oxide semiconductor film is 5% or more; a second oxide semiconductor film formation step (B) of forming a second oxide semiconductor film including In, Ga and Zn on the first oxide semiconductor film, wherein the second oxide semiconductor film includes no Sn, or an atomic ratio of Sn with respect to all metal elements of the second oxide semiconductor film is smaller than an atomic ratio of Sn with respect to all metal elements of the first oxide semiconductor film; a patterning step (C) of patterning a layered semiconductor film including the first oxide semiconductor film and the second oxide semiconductor film, thereby obtaining an oxide semiconductor layer to be an active layer of the thin film transistor; and an insulating layer formation step (D) of forming an insulating layer so as to cover the semiconductor layer or the thin film transistor, wherein in the patterning step (C), the first oxide semiconductor film and the second oxide semiconductor film are patterned by wet etching using a PAN-based etchant obtained by mixing together phosphoric acid, nitric acid and acetic acid.

In one embodiment, a thickness of the first oxide semiconductor film is 20 nm or less.

In one embodiment, the patterning step (C) is performed under such a condition that a first angle θ1 between a side surface and a lower surface of a lower oxide semiconductor layer that is obtained by patterning the first oxide semiconductor film is smaller than a second angle θ2 between a side surface and a lower surface of an upper oxide semiconductor layer that is obtained by patterning the second oxide semiconductor film.

In one embodiment, the manufacturing method further includes a step of forming a layered conductive film including a molybdenum film and a copper film arranged on the molybdenum film so as to cover the semiconductor layer and the gate insulating layer, and patterning the layered conductive film, thereby forming the source electrode and the drain electrode, wherein in the patterning of the layered conductive film, the copper film and the molybdenum film are patterned using a hydrogen peroxide-based etchant.

In one embodiment, the first oxide semiconductor film includes an In—Ga—Zn—Sn—O-based semiconductor, and the second oxide semiconductor film includes an In—Ga—Zn—O-based semiconductor.

According to one embodiment of the present invention, it is possible to provide a semiconductor device including oxide semiconductor TFTs that can have a high mobility and a high reliability.

DETAILED DESCRIPTION

First Embodiment

A semiconductor device of a first embodiment will now be described with reference to the drawings. The semiconductor device of the present embodiment generally includes circuit boards such as active matrix substrates, various display devices, electronic devices, etc., as long as it has oxide semiconductor TFTs (hereinafter, "TFTs").

Figure 1A:
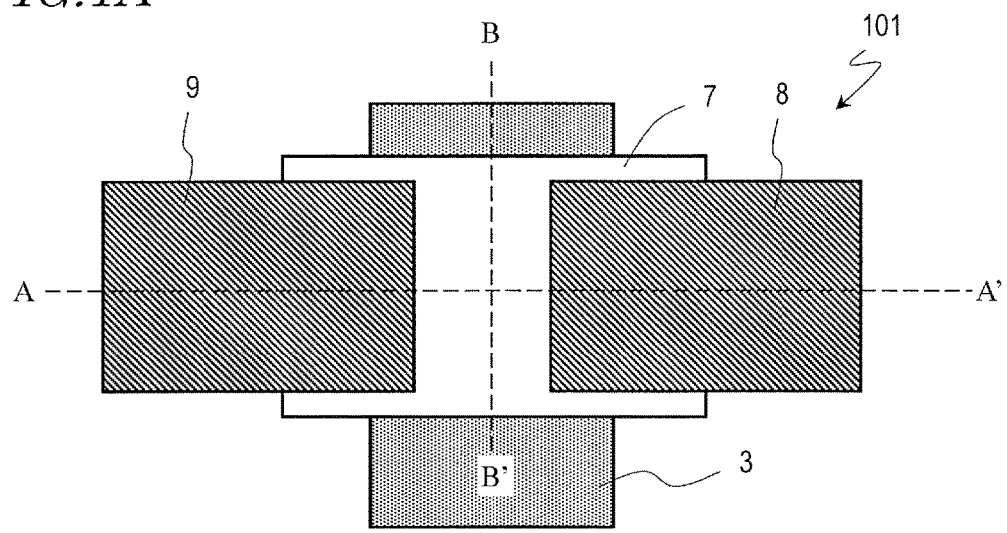
FIG. 1A is a schematic plan view showing a TFT 101 of a semiconductor device of a first embodiment.
Figure 1B:
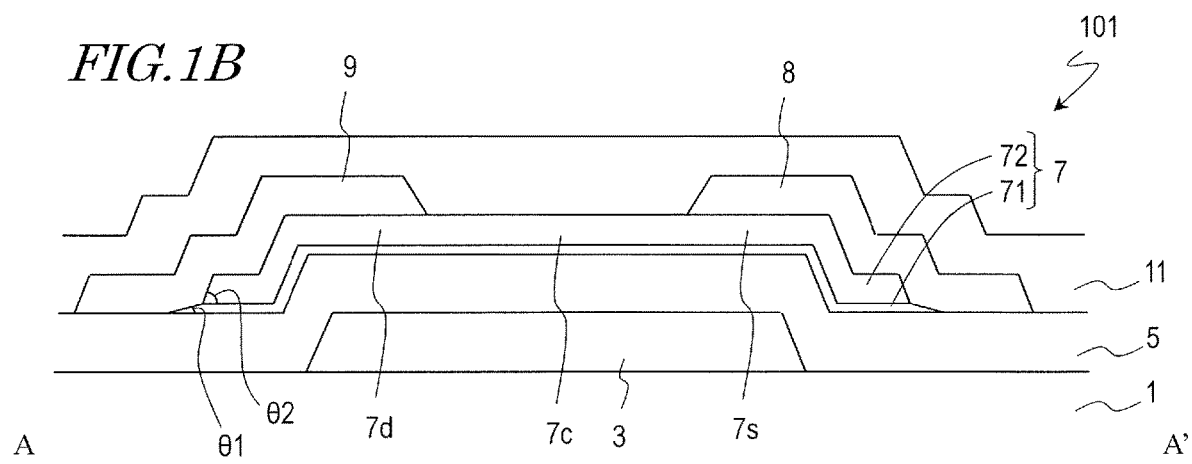
FIGS. 1B and 1C are schematic cross-sectional views showing the TFT 101 taken along line A-A' and line B-B', respectively.
Figure 1C:
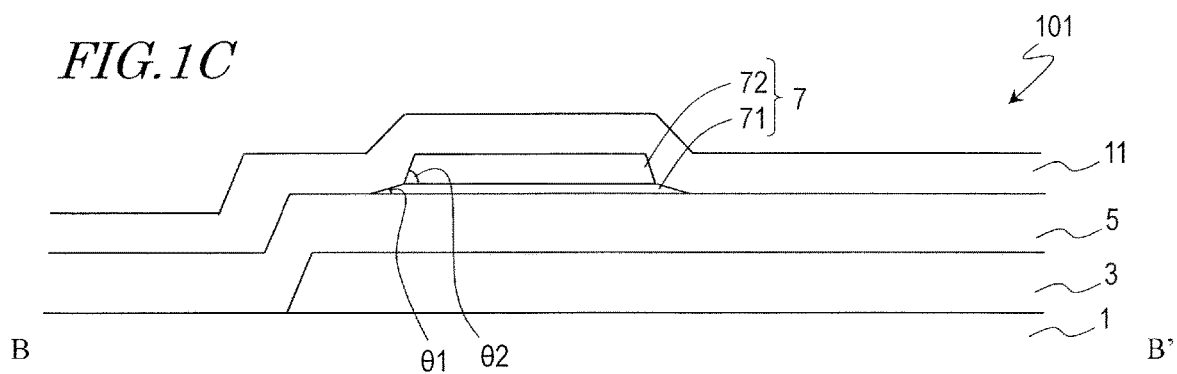

FIG. 1A is a schematic plan view showing an example of a TFT 101 in the semiconductor device of the present embodiment, and FIG. 1B and FIG. 1C are schematic cross-sectional views taken along line A-A' and line B-B' of FIG. 1A, respectively.

The semiconductor device of the present embodiment includes a substrate 1, and an oxide semiconductor TFT (hereinafter referred to simply as the "TFT") 101 supported on the substrate 1.

The TFT 101 includes a gate electrode 3 supported on the substrate 1, a semiconductor layer 7 including an oxide semiconductor, a gate insulating layer 5 arranged between the semiconductor layer 7 and the gate electrode 3, and a source electrode 8 and a drain electrode 9 electrically connected to the semiconductor layer 7. The TFT 101 may be covered by an inorganic insulating layer (passivation film) 11.

In this example, the TFT 101 is a channel-etched bottom gate structure TFT. The gate electrode 3 is arranged on the substrate 1 side of the semiconductor layer 7. The gate insulating layer 5 covers the gate electrode 3. The semiconductor layer 7 is arranged on the gate insulating layer 5 so as to overlap with the gate electrode 3 with the gate insulating layer 5 interposed therebetween. The source electrode 8 and the drain electrode 9 are each arranged so as to be in contact with a portion of the upper surface of the semiconductor layer 7. A portion of the semiconductor layer 7 that is in contact with the source electrode 8 is referred to as a source contact region 7s, and a portion thereof that is in contact with the drain electrode 9 is referred to as a drain contact region 7d. As seen from the direction normal to the substrate 1, a region that is located between the source contact region 7s and the drain contact region 7d and overlaps with the gate electrode 3 is a "channel region 7c".

In the present embodiment, the semiconductor layer 7 has a layered structure. The layered structure of the semiconductor layer 7 includes a lower oxide semiconductor layer 71 that includes In, Ga, Zn and Sn, and an upper oxide semiconductor layer 72 that is arranged on the lower oxide semiconductor layer 71 and includes In, Ga and Zn. The atomic ratio of Sn with respect to all metal elements of the lower oxide semiconductor layer 71 is 5% or more. The atomic ratio of Sn with respect to all metal elements of the upper oxide semiconductor layer 72 is lower than the atomic ratio of Sn with respect to all metal elements of the lower oxide semiconductor layer 71. The upper oxide semiconductor layer 72 may include substantially no Sn.

The atomic ratio of In with respect to all metal elements of the lower oxide semiconductor layer 71 may be higher than the atomic ratio of In with respect to all metal elements of the upper oxide semiconductor layer 72. Then, the mobility of the lower oxide semiconductor layer 71 can be made higher than the mobility of the upper oxide semiconductor layer 72. That is, the lower oxide semiconductor layer 71 of the semiconductor layer 7 can function as a layer where the carrier primarily flows (hereinafter, the "carrier transfer layer").

The lower oxide semiconductor layer 71 may be the lowermost layer (a layer that is located closest to the substrate 1) of the semiconductor layer 7. The upper oxide semiconductor layer 72 is an uppermost layer of the semiconductor layer 7, and the upper surface thereof may be in contact with an inorganic insulating layer 11. Each of the lower oxide semiconductor layer 71 and the upper oxide semiconductor layer 72 may be a single layer or may have a layered structure composed of a plurality of layers having different composition ratios.

In this example, the lower oxide semiconductor layer 71 includes an In—Ga—Zn—Sn—O-based semiconductor. The atomic ratio In:Ga:Zn:Sn between In, Ga, Zn and Sn of the lower oxide semiconductor layer 71 may be 4:1:4:1, for example. On the other hand, the upper oxide semiconductor layer 72 includes an In—Ga—Zn—O-based semiconductor. The atomic ratio In:Ga:Zn between In, Ga and Zn of the upper oxide semiconductor layer 72 may be 1:3:6 or 1:1:1, for example.

Figure 2A:
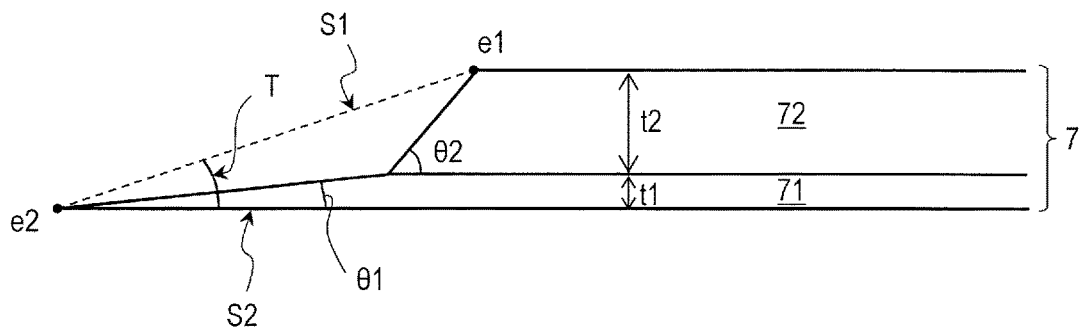
FIGS. 2A and 2B are enlarged cross-sectional views each illustrating the shape of the side surface of a semiconductor layer 7.

FIG. 2A is an enlarged cross-sectional view illustrating the tapered shape of the semiconductor layer 7. With the semiconductor layer 7 of the present embodiment, the angle θ1 between the side surface and the lower surface (the slope angle of the side surface) of the lower oxide semiconductor layer 71 is smaller than the angle θ2 between the side surface and the lower surface (the slope angle of the side surface) of the upper oxide semiconductor layer 72. Such a structure can be formed by controlling the ratio between the etching rates of the oxide semiconductors included in the lower oxide semiconductor layer 71 and the upper oxide semiconductor layer 72 in the step of patterning the semiconductor layer 7, as will be described later.

In the present embodiment, since the active layer of the TFT 101 has the lower oxide semiconductor layer 71 including a high mobility material, it is possible to realize a high TFT mobility and improve the ON characteristics. On the other hand, as described above, with a high mobility material such as an In—Ga—Zn—Sn—O-based semiconductor, deterioration due to moisture, hydrogen, etc., is more likely to occur than an In—Ga—Zn—O-based semiconductor. In contrast, in the present embodiment, the side surface of the semiconductor layer 7 has a step. Specifically, the slope angle θ1 of the side surface of the lower oxide semiconductor layer 71, which is the lower layer, is smaller than the slope angle θ2 of the side surface of the upper oxide semiconductor layer 72, which is the upper layer. Thus, the side surface of the semiconductor layer 7 slopes more gently on the substrate 1 side, and it is therefore possible to improve the coverage of the protection film such as the inorganic insulating layer 11 covering the TFT 101.

By providing the lower oxide semiconductor layer 71 having a smaller side surface slope angle θ, the taper angle T of the semiconductor layer 7 in the TFT 101 can be made smaller than a single-layer oxide semiconductor layer composed only of an In—Ga—Zn—O-based semiconductor, for example. As used herein, "the taper angle T of the semiconductor layer 7" refers to the angle between the virtual surface S1 that connects together the upper surface circumference e1 of the semiconductor layer 7 and the lower surface circumference e2 of the semiconductor layer 7, and the lower surface S2 of the semiconductor layer 7, along a cross section perpendicular to the substrate 1, as shown in FIG. 2A. By realizing a small taper angle T of the semiconductor layer 7, it is possible to more effectively improve the coverage of the protection film such as the inorganic insulating layer 11.

Figure 12:
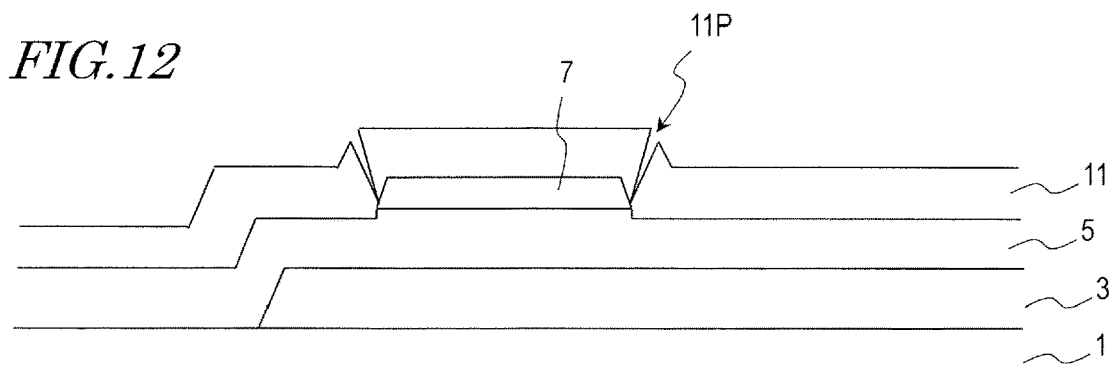
FIG. 12 is a schematic cross-sectional view illustrating a problem of a conventional oxide semiconductor TFT.

With a conventional oxide semiconductor TFT, the angle of the side surface (taper angle) of the semiconductor layer 7 may become large, thereby lowering the coverage of the inorganic insulating layer 11, as illustrated in FIG. 12. Therefore, a crack 11P, or the like, may occur in a protection film such as the inorganic insulating layer 11, allowing moisture, hydrogen, etc., to enter the semiconductor layer 7 from the outside through the crack 11P.

In contrast, according to the present embodiment, it is possible to improve the coverage of the protection film, and it is therefore possible to more effectively suppress the entrance of moisture, hydrogen, etc., into the semiconductor layer 7 (particularly, the lower oxide semiconductor layer 71) of the TFT 101. Therefore, even if a high mobility material is used, which is likely to lead to characteristics deterioration due to the entrance of moisture, etc., it is possible to suppress TFT characteristics deterioration (depletion), thereby realizing both a high reliability and a high TFT mobility.

The side surface slope angle θ1 of the lower oxide semiconductor layer 71 of the semiconductor layer 7 may be greater than 0° and 10° or less, for example, although there is no particular limitation. If 10° or less, it is possible to further increase the coverage of the inorganic insulating layer 11. The side surface slope angle θ2 of the upper oxide semiconductor layer 72 may be greater than 10° and 70° or less. Preferably, it is 30° or more and 60° or less. If the side surface slope angle θ2 is 30° or more, it is possible to reduce the CD loss (side etching length). If 60° or less, it is possible to more effectively increase the coverage of the inorganic insulating layer 11.

The taper angle T of the semiconductor layer 7 may be greater than 10° and 30° or less, for example. If 30° or less, it is possible to improve the coverage of the inorganic insulating layer 11, and it is therefore possible to suppress lowering of TFT characteristics, which occurs due to moisture, etc., entering the lower oxide semiconductor layer 71. Preferably, it is greater than 10° and 25° or less.

The thickness t1 of the lower oxide semiconductor layer 71 may be smaller than the thickness t2 of the upper oxide semiconductor layer 72. Then, it is possible to improve the coverage of the inorganic insulating layer 11 while protecting the lower oxide semiconductor layer 71 by means of the upper oxide semiconductor layer 72.

The thickness t1 of the lower oxide semiconductor layer 71 may be 20 nm or less, for example. Then, a first oxide semiconductor film to be the lower oxide semiconductor layer 71 (e.g., an In—Ga—Zn—Sn—O-based semiconductor film) can be patterned using a PAN-based etchant, as will be described later. The thickness t1 may be less than 20 nm or 15 nm or less, for example. If the thickness t1 is 5 nm or more, it is possible to more effectively improve the coverage of the inorganic insulating layer 11.

The thickness t2 of the upper oxide semiconductor layer 72 may be 20 nm or more and 100 nm or less, for example, although there is no particular limitation. If 20 nm or more, it is possible to suppress damage on the lower oxide semiconductor layer 71, which is the carrier transfer layer, caused by a process such as the source/drain separation step. On the other hand, if 100 nm or less, it is possible to suppress lowering of the coverage of the inorganic insulating layer 11.

Figure 2B:
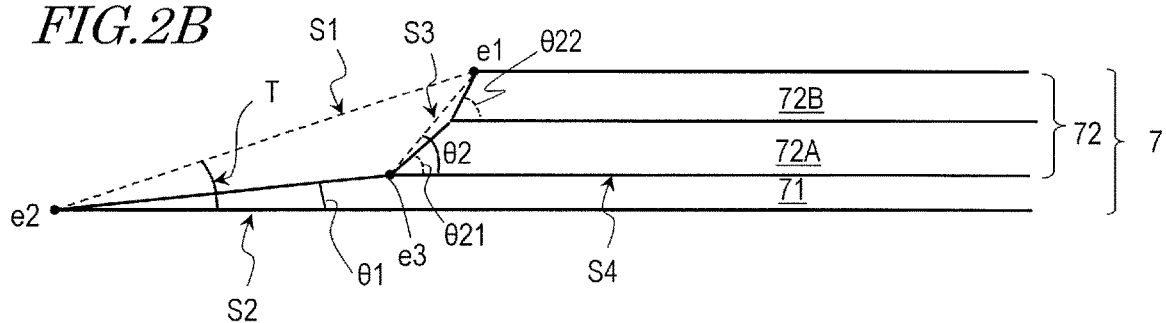

The lower oxide semiconductor layer 71 and the upper oxide semiconductor layer 72 may each have a layered structure. As shown in FIG. 2B, for example, the upper oxide semiconductor layer 72 may have a two-layer structure including a first upper layer 72A and a second upper layer 72B in this order from the lower oxide semiconductor layer 71 side. The first upper layer 72A and the second upper layer 72B may have different compositions or composition ratios from each other. For example, the first upper layer 72A and the second upper layer 72B may each include an In—Ga—Zn—O-based semiconductor, and the atomic ratio In:Ga:Zn between In, Ga and Zn may differ between the first upper layer 72A and the second upper layer 72B.

Where the upper oxide semiconductor layer 72 has a layered structure, the side surface slope angle θ2 of the upper oxide semiconductor layer 72 refers to the taper angle of the upper oxide semiconductor layer 72 as a whole. In this example, along a cross section perpendicular to the substrate 1 shown in FIG. 2B, the side surface slope angle θ2 is an angle between a virtual surface S3 and a lower surface S4 of the upper oxide semiconductor layer 72, wherein the virtual surface S3 is a surface that connects together the lower surface circumference e3 of the upper oxide semiconductor layer 72 (herein, the lower surface circumference of the first upper layer 72A) and the upper surface circumference e1 of the upper oxide semiconductor layer 72 (herein, the upper surface circumference of the second upper layer 72B).

Note that the side surface slope angle θ21 of the first upper layer 72A and the side surface slope angle θ22 of the second upper layer 72B may each be greater than the side surface slope angle θ1 of the lower oxide semiconductor layer 71. For example, the slope angles θ21 and θ22 may each be greater than 10° and 70° or less. These slope angles θ21 and θ22 may be generally equal to each other or may be different from each other.

<Method for Forming Semiconductor Layer 7>

The semiconductor layer 7 having such a tapered shape can be formed as follows, for example.

First, a first oxide semiconductor film (e.g., an In—Ga—Zn—Sn—O-based semiconductor film) to be the lower oxide semiconductor layer 71 and a second oxide semiconductor film (e.g., an In—Ga—Zn—O-based semiconductor film) to be the upper oxide semiconductor layer 72 are formed in this order on the gate insulating layer 5 using a sputtering method, for example, thereby obtaining a layered film. The oxide semiconductor films have compositions and thicknesses corresponding to the lower oxide semiconductor layer 71 and the upper oxide semiconductor layer 72, respectively.

Next, the layered film is patterned to obtain the semiconductor layer 7. The patterning of the layered film is herein performed by wet etching using a PAN-based etchant obtained by mixing together phosphoric acid, nitric acid and acetic acid. Since the etching rate of the first oxide semiconductor film for the PAN-based etchant is lower than that of the second oxide semiconductor film, it is possible to obtain the semiconductor layer 7 having such a tapered shape as described above.

Patent Document No. 1 discloses patterning an In—Ga—Zn—Sn—O-based semiconductor film with an oxalic acid-based etchant (e.g., Kanto Chemical: ITO-07N). However, a study by the present inventors revealed that when an In—Ga—Zn—Sn—O-based semiconductor film (or a layered film of an In—Ga—Zn—Sn—O-based semiconductor film and an In—Ga—Zn—O-based semiconductor film) is etched using an oxalic acid-based etchant, there is a problem that Zn is likely to separate as the soluble concentration of Zn to oxalic acid is low.

On the other hand, an In—Ga—Zn—Sn—O-based semiconductor has conventionally been known as a material that has an etching resistance against a PAN-based etchant, and a PAN-based etchant has not been used for etching an In—Ga—Zn—Sn—O-based semiconductor film. For example, Table 3 of Non-Patent Document No. 1 clearly shows that an In—Ga—Zn—Sn—O-based semiconductor film is insoluble to a PAN-based etchant. Patent Document No. 1 has no reference to the use of a PAN-based etchant as an etchant for an In—Ga—Zn—Sn—O-based semiconductor film.

Against this preconceived notion, the present inventors gave consideration to using a PAN-based etchant as an etchant for a layered film including an In—Ga—Zn—Sn—O-based semiconductor film. As a result of the study, the present inventors found that an In—Ga—Zn—Sn—O-based semiconductor film, if it is thin (thickness: 20 nm or less, for example), can be etched using a PAN-based etchant.

This will now be elaborated while also showing the experimental results by the present inventors.

The present inventors formed In—Ga—Zn—Sn—O-based semiconductor films (single layers) with different thicknesses on substrates, and examined whether they can be etched with a PAN-based etchant. Note that it was determined in the experiment to be "unetchable" when etching rate<0.05 nm/sec.

Figure 3:
FIG. 3 is a graph showing the relationship between the thickness of an In—Ga—Zn—Sn—O-based semiconductor film and the etching rate.

The results are shown in Table 1 and FIG. 3. FIG. 3 is a graph showing the relationship between the thickness of an In—Ga—Zn—Sn—O-based semiconductor film and the etching rate.

TABLE 1

| Thickness of In—Ga—Zn—Sn—O-based semiconductor film (nm) | Etchability | Etching rate (nm/sec) |
| --- | --- | --- |
| 10 | ○ | 0.20 |
| 15 | ○ | 0.17 |
| 20 | Δ | 0.08 |
| 25 | x | |
| 30 | x | |

It can be seen from the results shown in Table 1 and FIG. 3 that although the etching rate of an In—Ga—Zn—Sn—O-based semiconductor film for a PAN-based etchant is low, the film is etchable if the thickness thereof is 20 nm or less.

It was also confirmed that the etching rate of an In—Ga—Zn—Sn—O-based semiconductor film for a PAN-based etchant is sufficiently lower than that of an In—Ga—Zn—O-based semiconductor film (e.g., the etching rate is 2.5 nm/sec when In:Ga:Zn=1:1:1, In:Ga:Zn=1:3:6).

Based on this, it was found that by making an In—Ga—Zn—Sn—O-based semiconductor film thin, it is possible to pattern a layered film of an In—Ga—Zn—Sn—O-based semiconductor film and an In—Ga—Zn—O-based semiconductor film with a PAN-based etchant, and it is possible to form the semiconductor layer 7 having a tapered shape (θ1<θ2) as shown in FIG. 2.

The oxide semiconductor composition and the thickness of the lower oxide semiconductor layer 71 and those of the upper oxide semiconductor layer 72 may be selected so that the etching rate of the upper oxide semiconductor layer 72 for a PAN-based etchant is 5 times or more and 50 times or less, preferably 10 times or more and 30 times or less, of that of the lower oxide semiconductor layer 71. If 5 times or more, the side surface slope angle θ1 of the lower oxide semiconductor layer 71 can be more reliably made small. If 50 times or less, the CD loss can be reduced.

For example, where the etching rate of the lower oxide semiconductor layer 71 is 0.08 nm/sec or more and 0.20 nm/sec or less, the upper oxide semiconductor layer 72 preferably includes substantially no Sn in order to realize such an etching rate ratio as described above. For example, an oxide semiconductor where In:Ga:Zn=1:1:1 or 1:3:6 (etching rate: about 2.5 nm/sec) may be used.

Figure 4:
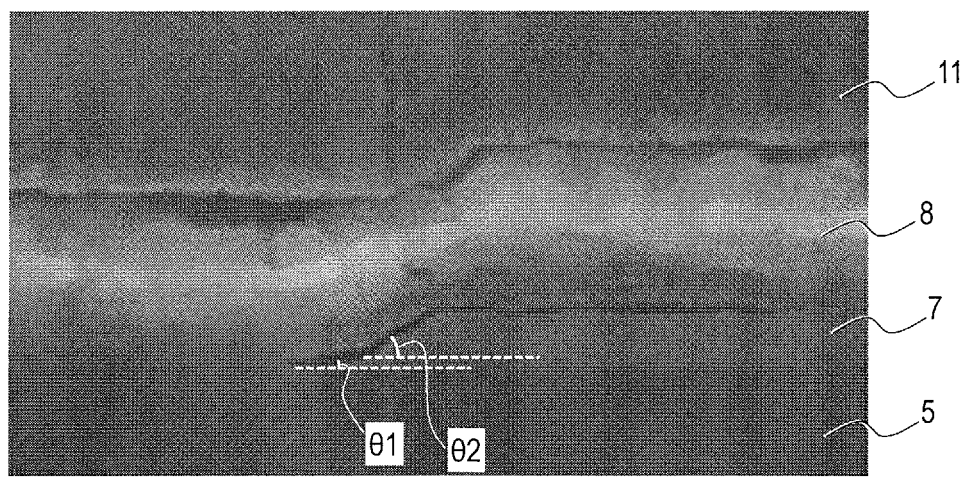
FIG. 4 shows a cross-sectional SEM image of a TFT of Embodiment Example.

FIG. 4 shows a cross-sectional SEM image of a TFT of Embodiment Example. In FIG. 4 and subsequent figures, like elements to those of FIGS. 1A to 1C are denoted by like reference signs.

In Embodiment Example shown in FIG. 4, the semiconductor layer 7 is formed by patterning a layered film of an In—Ga—Zn—Sn—O-based semiconductor film (In:Ga:Zn:Sn=4:1:4:1, thickness: 10 nm) and an In—Ga—Zn—O-based semiconductor film (In:Ga:Zn=1:3:6, thickness: 90 nm) using a PAN-based etchant. As described above, it can be seen that the side surface slope angle θ1 of the lower oxide semiconductor layer 71 is smaller than the side surface slope angle θ2 of the upper oxide semiconductor layer 72, and the semiconductor layer 7 has a gently tapered shape. In the example shown in FIG. 4, the slope angle θ1 is 4°, the slope angle θ2 is 37°, and the taper angle T is 20°.

<Compositions of Layers of Semiconductor Layer 7>

Preferred compositions of the layers will now be described. In the following description, the atomic ratio (composition ratio) of In with respect to all metal elements of an oxide semiconductor will be abbreviated as the "In ratio", and the atomic ratio of Zn with respect to all metal elements of an oxide semiconductor as the "Zn ratio". For example, the In ratio of an In—Ga—Zn—O-based semiconductor layer is a ratio of the atomic number of In with respect to the total atomic number of In, Ga and Zn. Where the atomic number of In is denoted as [In], the atomic number of Ga as [Ga] and the atomic number of zinc as [Zn], the In ratio is represented as [In]/([In]+[Ga]+[Zn]).

As described above, the lower oxide semiconductor layer 71 includes In, Ga, Zn and Sn. The Sn ratio is 5% or more. The lower oxide semiconductor layer 71 may be an In—Ga—Zn—Sn—O-based semiconductor. Although there is no particular limitation on the ratio of each metal element, the In ratio of the lower oxide semiconductor layer 71 may be 20% or more and 45% or less, and preferably 25% or more and 45% or less, for example. The Ga ratio of the lower oxide semiconductor layer 71 may be 5% or more and 20% or less, the Zn ratio may be 30% or more and 60% or less, and the Sn ratio may be 5% or more and 25% or less. The In ratio may be greater than 2.0 times the Ga ratio ([In]/[Ga]>2.0). Then, it is possible to realize a higher mobility. The Zn ratio may be greater than 2.4 times of the Sn ratio ([Zn]/[Sn]>2.4). Then, it is possible to suppress an increase in the conductivity due to crystalline Sn oxide. The composition, the method of formation, the characteristics, etc., of the lower oxide semiconductor layer 71 are described in Patent Document No. 1, for example. The entire disclosure of Patent Document No. 1 (Japanese Laid-Open Patent Publication No. 2017-157813) is herein incorporated by reference.

There is no limitation on the composition ratio of the upper oxide semiconductor layer 72 as long as the upper oxide semiconductor layer 72 includes In, Ga and Zn. It may further include a metal element other than In, Ga and Zn. In the present embodiment, since a channel does not need to be formed in the upper oxide semiconductor layer 72, the In ratio does not need to be high. For example, the In ratio of the upper oxide semiconductor layer 72 may be less than or equal to the Zn ratio or may be less than the Zn ratio. When the Zn ratio of the upper oxide semiconductor layer 72 is high (e.g., [Zn]≥⅓), the upper oxide semiconductor layer 72 can have a high crystallinity and thus have a good etching resistance and a good barrier property. Therefore, it can function as a protection layer and a sacrificial layer for the lower oxide semiconductor layer 71.

Moreover, the In ratio of the lower oxide semiconductor layer 71 may be greater than the In ratio of the upper oxide semiconductor layer 72. Then, the mobility of the lower oxide semiconductor layer 71 can be made higher than the upper oxide semiconductor layer 72, and the lower oxide semiconductor layer 71 can therefore function as the carrier transfer layer.

The upper oxide semiconductor layer 72 may include substantially no Sn, and the Sn ratio of the lower oxide semiconductor layer 71 may be 5% or more (e.g., 10% or more). Then, it is possible to more reliably ensure a sufficient difference in etching rate for a PAN-based etchant between the lower oxide semiconductor layer 71 and the upper oxide semiconductor layer 72, and to form the semiconductor layer 7 having a desired tapered shape.

When the upper oxide semiconductor layer 72 has a two-layer structure (FIG. 2B), the second upper layer 72B, which is the upper layer, may be a layer having a high crystallinity. For example, the In ratio of the second upper layer 72B may be smaller than the Zn ratio. Where the first upper layer 72A and the second upper layer 72B both include an In—Ga—Zn—O-based semiconductor, the In ratio of the second upper layer 72B may be smaller than the In ratio of the first upper layer 72A.

The first upper layer 72A may have a higher mobility than the second upper layer 72B. Then, it is possible to suppress lowering of the TFT mobility caused by the provision of the upper oxide semiconductor layer 72. The lower oxide semiconductor layer 71 and the second upper layer 72B may be crystalline, and the first upper layer 72A may be amorphous. Then, it is possible to suppress variations of the TFT characteristics by providing the amorphous first upper layer 72A therebetween.

Where an In—Ga—Zn—O-based semiconductor is used for the upper oxide semiconductor layer 72, the atomic ratio In:Ga:Zn may be (3:1:2), (4:2:3), (5:1:3), (5:3:4), (6:2:4), (7:1:3), (5:1:4), (1:3:2), (2:4:3), (1:5:3), (1:3:6), (1:1:1), etc., for example.

The total thickness of the semiconductor layer 7 may be 20 nm or more and 130 nm or less, for example, although there is no particular limitation.

<Method for Manufacturing TFT 101>

An example of a method for manufacturing the TFT 101 will now be described with reference to FIG. 5A to FIG. 5E.

Figure 5A:
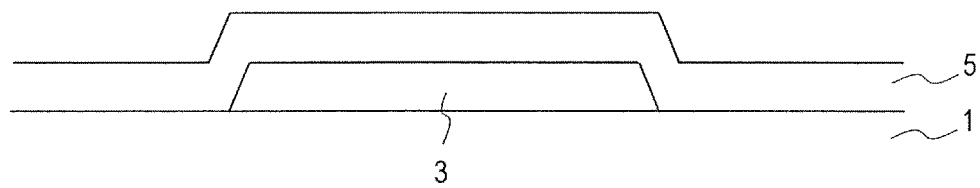
FIGS. 5A to 5E are step-by-step cross-sectional views illustrating a method for manufacturing the TFT 101.

First, as shown in FIG. 5A, the gate electrode 3 is formed on the substrate 1. Next, the gate insulating layer 5 is formed so as to cover the gate electrode 3.

The substrate 1 may be a glass substrate, a silicon substrate, a plastic substrate (resin substrate) having a heat resistance, etc., for example.

The gate electrode 3 can be formed by using the same conductive film as a gate bus line GL to be described later (hereinafter, the "gate conductive film"). Herein, the gate conductive film (not shown) (thickness: 50 nm or more and 500 nm or less, for example) is formed on a substrate (e.g., a glass substrate) 1 by a sputtering method, or the like. Next, the gate electrode 3 is obtained by patterning the gate conductive film. A layered film whose lower layer of a Ti film (thickness: 30 nm) or an Mo film and whose upper layer is a Cu film (thickness: 300 nm), for example, is used as the gate conductive film. Note that there is no particular limitation on the material of the gate conductive film. A film that includes a metal, such as aluminum (Al), tungsten (W), molybdenum (Mo), tantalum (Ta), chromium (Cr), titanium (Ti), copper (Cu), etc., or an alloy thereof, or a metal nitride thereof, may suitably be used.

The gate insulating layer 5 can be formed by a CVD method, or the like. A silicon oxide ($SiO_2$) layer, a silicon nitride (SiNx) layer, a silicon oxide nitride (SiOxNy; x>y) layer, a silicon nitride oxide (SiNxOy; x>y) layer, or the like, may suitably be used as the gate insulating layer 5. The gate insulating layer 5 may have a layered structure. For example, a silicon nitride layer, a silicon nitride oxide layer, or the like, may be formed on the substrate side (the lower layer) in order to prevent diffusion of an impurity, etc., from the substrate 1, and a silicon oxide layer, a silicon oxide nitride layer, or the like, may be formed on a layer thereon (the upper layer) in order to ensure insulation. Herein, a layered film including an $SiO_2$ film having a thickness of 50 nm as the upper layer and an SiNx film having a thickness of 300 nm as the lower layer is used. Thus, where an insulating layer that contains oxygen (e.g., an oxide layer such as $SiO_2$) is used as the uppermost layer of the gate insulating layer 5 (i.e., a layer in contact with the oxide semiconductor layer), when the semiconductor layer has oxygen deficiency, it is possible to recover from oxygen deficiency using oxygen contained in the oxide layer, thus reducing oxygen deficiency in the semiconductor layer 7.

Figure 5B:
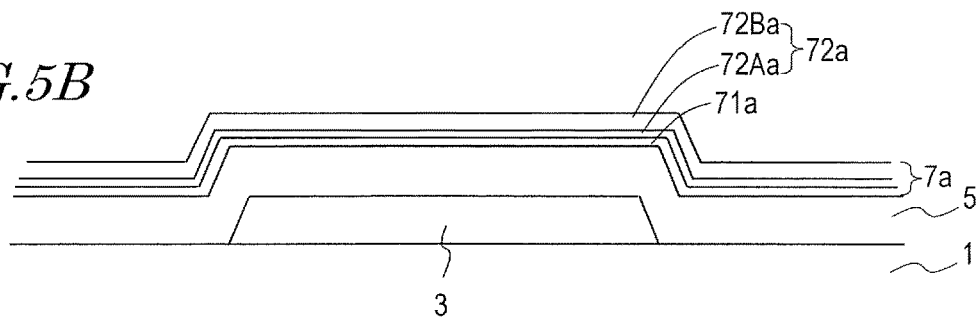

Then, as shown in FIG. 5B, a first oxide semiconductor film 71a and a second oxide semiconductor film 72a are formed on the gate insulating layer 5 using a sputtering method, for example, from the gate insulating layer 5 side, thereby obtaining a layered film 7a. The first oxide semiconductor film 71a is a film that primarily contains an In—Ga—Zn—Sn—O-based semiconductor (In:Ga:Zn:Sn=4:1:4:1), for example. The second oxide semiconductor film 72a is a film that primarily contains an In—Ga—Zn—O-based semiconductor (In:Ga:Zn=1:1:1 or 1:3:6), for example. In this example, the second oxide semiconductor film 72a has a layered structure including a lower layer 72Aa whose atomic ratio In:Ga:Zn is 1:1:1 and an upper layer 72Ba whose atomic ratio In:Ga:Zn is 1:3:6. Each oxide semiconductor film may be a crystalline oxide semiconductor film or may be an amorphous oxide semiconductor film. The thickness of the first oxide semiconductor film 71a may be 10 nm, for example, and the thickness of the second oxide semiconductor film 72a may be 30 nm, for example.

The first and second oxide semiconductor films 71a and 72a can be formed by a sputtering method using a target that has the composition described above, for example. A mixed gas of rare gas atoms such as argon and an oxidizing gas may be used as the sputtering gas (atmosphere). The oxidizing gas may be $O_2$, $CO_2$, $O_3$, $H_2O$, $N_2O$, etc. Herein, a mixed gas including an Ar gas and an oxygen ($O_2$) gas is used.

Next, an annealing treatment of the layered film 7a is performed. Herein, a heat treatment is performed in the atmosphere at a temperature of 300° C. or more and 500° C. or less. The heat treatment time is 30 minutes or more and 2 hours or less, for example.

Figure 5C:
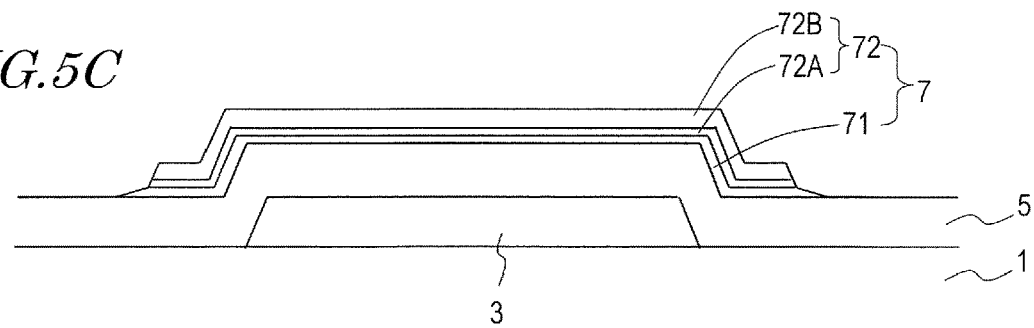

Then, as shown in FIG. 5C, the layered film 7a after the heat treatment is patterned to obtain the semiconductor layer 7. In the present embodiment, the patterning of the layered film 7a is performed by wet etching using a PAN-based etchant, for example. Thus, the semiconductor layer 7 including the lower oxide semiconductor layer 71 and the upper oxide semiconductor layer 72 in this order from the gate insulating layer 5 side is obtained. The semiconductor layer 7 has the tapered shape described above with reference to FIG. 2.

Figure 5D:
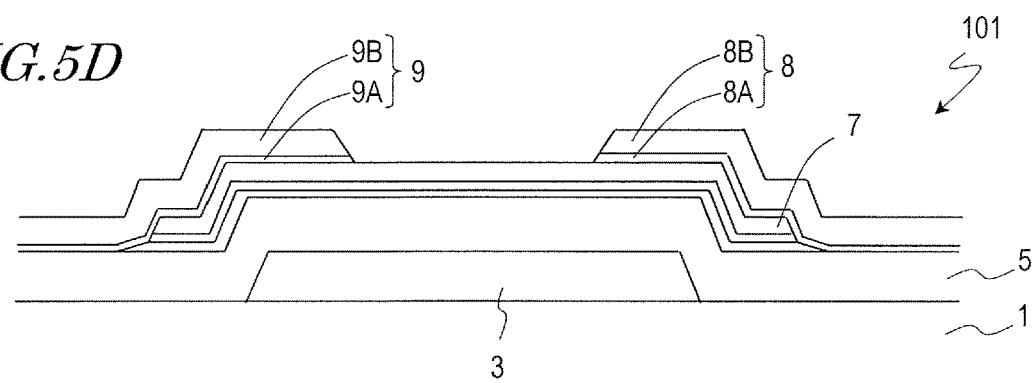

Next, as shown in FIG. 5D, the source electrode 8 and the drain electrode 9 are formed so as to be in contact with the upper surface of the semiconductor layer 7.

The source electrode 8 and the drain electrode 9 may have a single-layer structure or may have a layered structure. The source electrode 8 and the drain electrode 9 can be formed by using the same conductive film (hereinafter, "source conductive film") as a source bus line SL to be described later. A metal such as aluminum (Al), aluminum (Al), tungsten (W), molybdenum (Mo), tantalum (Ta), chromium (Cr), titanium (Ti), copper (Cu), etc., or an alloy thereof, or a metal nitride thereof, may suitably be used as the source conductive film.

Figure 6A:
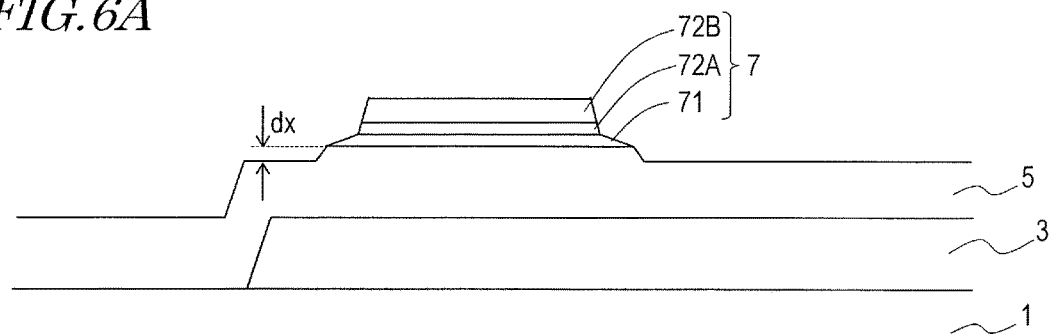
FIGS. 6A and 6B are step-by-step cross-sectional views illustrating the method for manufacturing the TFT 101.

In this example, a layered film including a Ti film (thickness: 30 nm) and a Cu film (thickness: 300 nm) layered in this order from the semiconductor layer 7 side is formed as the source conductive film. The source conductive film is formed by a sputtering method, or the like, for example. Then, a resist mask is formed on the source conductive film, and the source conductive film is patterned. Then, the source electrode 8 and the drain electrode 9 using a Ti film as the lower layer 8A, 9A and a Cu film as the upper layer 8B, 9B are obtained (source/drain separation). Herein, the Cu film of the upper layer may be patterned by wet etching using a hydrogen peroxide-based etchant, for example, and then the Ti film of the lower layer may be patterned by dry etching. In such a case, as illustrated in FIG. 6A, a surface portion (thickness: dx) of the gate insulating layer 5 may be etched in some cases during the dry etching of the Ti film along the B-B' cross section shown in FIGS. 1A to 1C. Then, an oxidation treatment, e.g., a plasma treatment using an $N_2O$ gas, for example, may be performed on the channel region of the semiconductor layer 7. Thus, the TFT 101 is obtained.

Figure 5E:
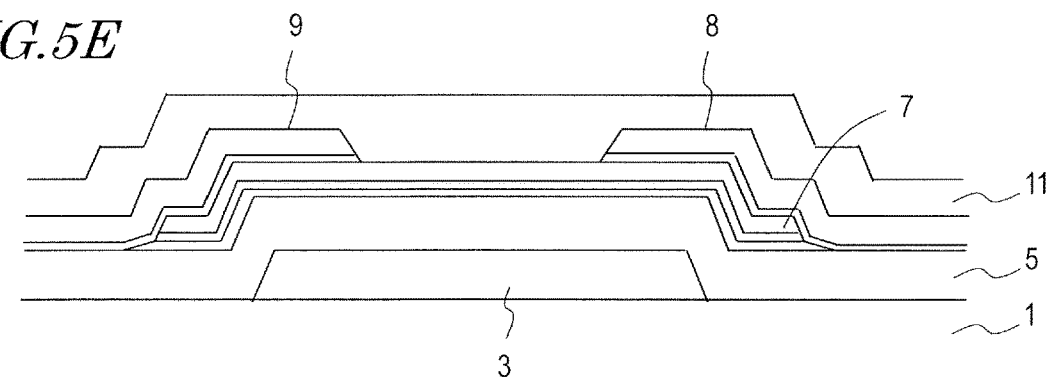

Next, as shown in FIG. 5E, the inorganic insulating layer 11 is formed so as to be in contact with the channel region 7c of the TFT 101. The inorganic insulating layer 11 may be a silicon oxide ($SiO_2$) film, a silicon nitride (SiNx) film, a silicon oxide nitride (SiOxNy; x>y) film, a silicon nitride oxide (SiNxOy; x>y) film, or the like, for example. Herein, an $SiO_2$ layer having a thickness of 300 nm, for example, is formed by a CVD method as the inorganic insulating layer. The temperature at which the inorganic insulating layer is formed may be 200° C. or more and 450° C. or less, for example. Although not shown in the figures, an organic insulating layer may be formed on the inorganic insulating layer 11. A positive-type photosensitive resin film having a thickness of 2000 nm, for example, may be formed as the organic insulating layer.

Figure 6B:
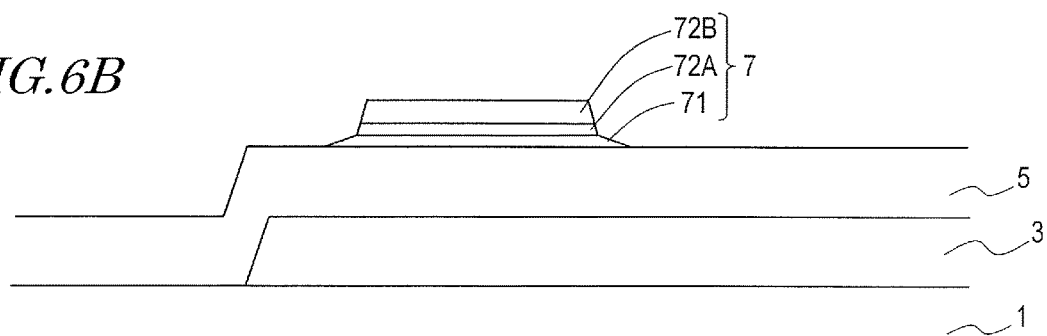

Note that although a layered film having a Ti film as the lower layer is used as the source conductive film in the method described above, a layered film having an Mo film as the lower layer may be used instead. For example, a layered film including two layers of an Mo film (thickness: 30 nm) and a Cu film (thickness: 300 nm) layered in this order from the semiconductor layer 7 side may be formed by a sputtering method as the source conductive film. In such a case, a Cu film and an Mo film may both be patterned by wet etching using a hydrogen peroxide-based etchant. Since there is no need to perform dry etching after wet etching, a surface potion of the gate insulating layer 5 is not etched in the patterning step of the source conductive film as illustrated in FIG. 6B. As a result, as compared with a case in which dry etching is performed, it is possible to reduce the step between the gate insulating layer 5 and the semiconductor layer 7, and it is therefore possible to more effectively improve the coverage of the inorganic insulating layer 11.

<Relationship Between Tapered Shape of Semiconductor Layer and Reliability of TFT>

The present inventors studied the relationship between the tapered shape of the semiconductor layer and the reliability of the TFT by producing and evaluating liquid crystal panels of Embodiment Example and Reference Example.

First, a liquid crystal panel of Embodiment Example was produced. With the liquid crystal panel of Embodiment Example, the pixel TFT was formed by using the method described above with reference to FIGS. 5A to 5E. The patterning of the semiconductor layer of the pixel TFT was performed using a PAN-based etchant. The semiconductor layer of the pixel TFT has a layered structure including an In—Ga—Zn—Sn—O-based semiconductor layer (thickness: 10 nm) where In:Ga:Zn:Sn=4:1:4:1 as the lower oxide semiconductor layer 71 and an In—Ga—Zn—O-based semiconductor layer (thickness: 90 nm) where In:Ga:Zn=1:3:6 as the upper oxide semiconductor layer 72. The side surface slope angle $\theta1$ of the lower oxide semiconductor layer 71 (e.g., 4°) is smaller than the side surface slope angle $\theta2$ of the upper oxide semiconductor layer 72 (e.g., 40°).

The liquid crystal panel of Reference Example was produced by a similar method using similar materials to those of Embodiment Example, except that the semiconductor layer of the pixel TFT was patterned with an oxalic acid etchant. The pixel TFT of Reference Example has a similar structure to the pixel TFT of Embodiment Example, except for the tapered shape (slope angle) of the semiconductor layer. In Reference Example, the side surface slope angles $\theta1$ and $\theta2$ of the lower oxide semiconductor layer (In—Ga—Zn—Sn—O-based semiconductor layer) and the upper oxide semiconductor layer (In—Ga—Zn—O-based semiconductor layer) are both 40°.

Next, the liquid crystal panels of Embodiment Example and Reference Example were subjected to an aging test by leaving them operative for 1000 hours under a high-temperature, high-humidity environment (herein, an temperature of 50° C. and a humidity of 95%) in order to examine changes in characteristics of pixel TFTs over the course of the aging test.

Specifically, the amount ΔVth by which the threshold voltage shifted in the negative direction through the aging test was measured for each of the TFTs located in the region R1 in the vicinity of the center of the mother glass surface of each liquid crystal panel, the region R3 in the vicinity of the circumference thereof, and the region R2 in the vicinity of the middle between the regions R1 and R3.

Figure 7:
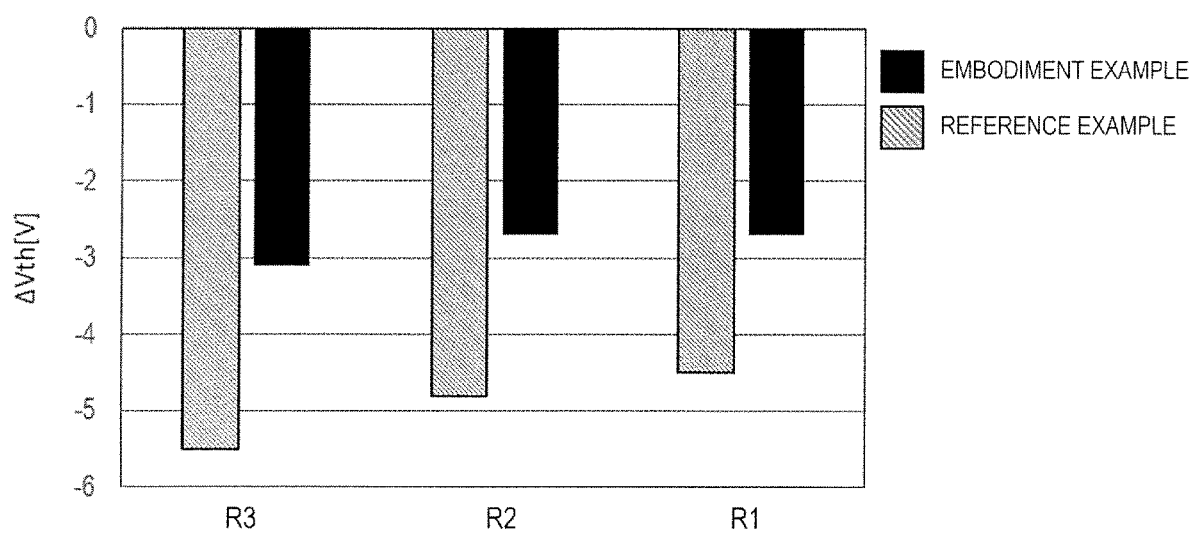
FIG. 7 is a graph showing the shift amount ΔVth of the threshold voltage of TFTs in a liquid crystal panel of Embodiment Example and that of Reference Example.

FIG. 7 is a graph showing the measurement results of the shift amount ΔVth of the threshold voltage of the TFTs located in the regions R1 to R3 of the liquid crystal panels of Embodiment Example and Reference Example.

As can be seen from FIG. 7, with the pixel TFTs of the Embodiment Example, the shift amount ΔVth of the threshold voltage in the negative direction is reduced as compared with the pixel TFTs of Reference Example. It is believed that this is because in Embodiment Example, the coverage of the passivation film is improved by controlling the tapered shape of the semiconductor layer of the pixel TFT, thereby suppressing the deterioration of the characteristics of the oxide semiconductor.

<Structure of Active Matrix Substrate>

The present embodiment can be applicable to an active matrix substrate of a display device, for example. It is only required that at least some of the TFTs provided on the active matrix substrate are TFTs of the present embodiment. For example, the TFT 101 described above can be applicable to pixel TFTs arranged in pixels and/or TFTs (circuit TFTs) of the monolithic driver.

The configuration of the active matrix substrate will now be described with reference to the drawings.

Figure 8:
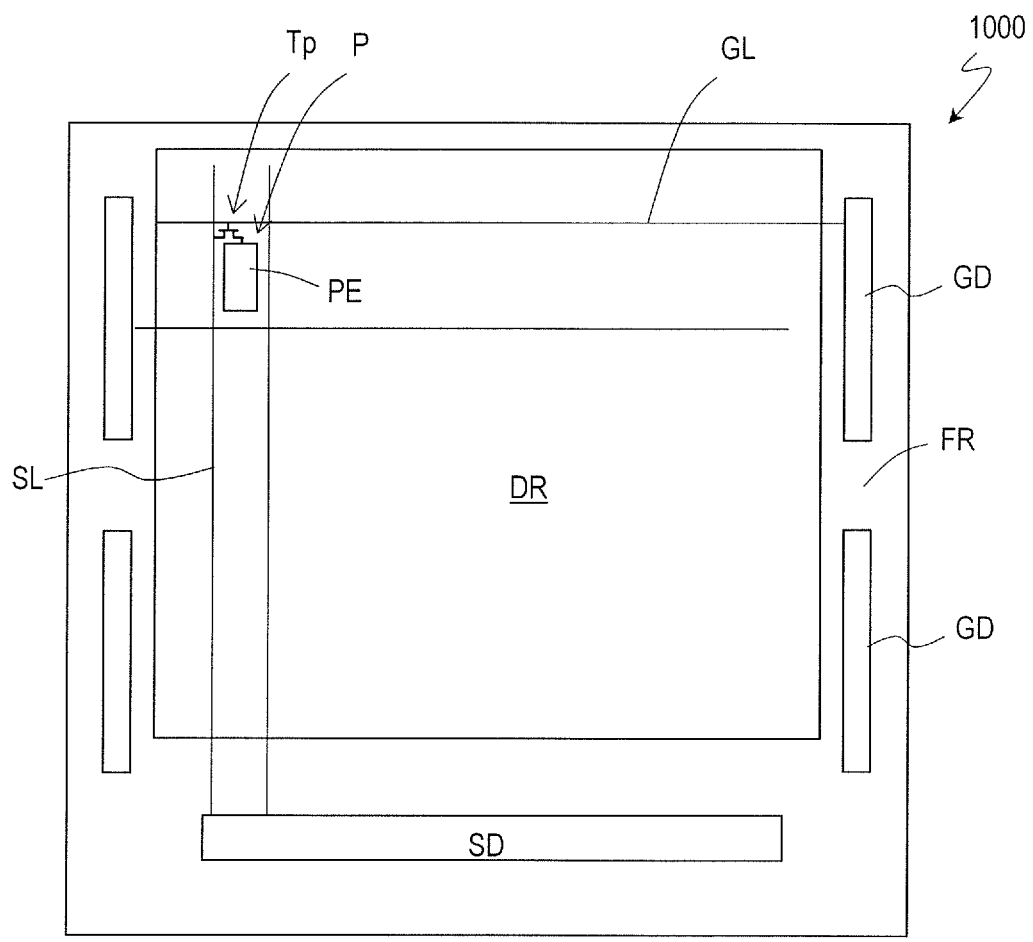
FIG. 8 is a schematic view showing an example of a planar structure of an active matrix substrate 1000 of the first embodiment.

FIG. 8 is a schematic view showing an example of the planar structure of the active matrix substrate 1000 of the present embodiment.

The active matrix substrate 1000 has a display region DR, and a region (the non-display region or bezel region) FR other than the display region DR. The display region DR includes pixel regions P arranged in a matrix pattern. The pixel region P is a region corresponding to a pixel of the display device, and may be referred to as simply a "pixel". Each pixel region P includes a thin film transistor Tp, which is a pixel TFT, and a pixel electrode PE. Although not shown in the figures, when the active matrix substrate 1000 is used as a display device of a transverse electric field mode such as an FFS (Fringe Field Switching) mode, a common electrode is provided on the active matrix substrate 1000 so as to oppose the pixel electrode PE with an insulating layer (dielectric layer) interposed therebetween.

The non-display region FR is a region that is located around the display region DR and does not contribute to display. The non-display region FR includes a terminal portion formation region where terminal portions are formed, a driving circuit formation region where driving circuit are provided integrally (monolithically), etc. In the driving circuit formation region, a gate driver GD, a test circuit (not shown), etc., are provided monolithically, for example. A source driver SD is mounted on the active matrix substrate 1000, for example. A plurality of gate bus lines GL extending in the row direction and a plurality of source bus lines SL extending in the column direction are formed in the display region DR. The pixels are defined by the gate bus lines GL and the source bus lines SL, for example. Each gate bus line GL is connected to a terminal of the gate driver GD. Each source bus line SL is connected to a terminal of the source driver SD mounted on the active matrix substrate 1000.

Configuration of Pixel Region P

Next, the configuration of each pixel region P of the active matrix substrate 1000 will be described. Herein, an active matrix substrate used in an LCD panel of an FFS mode will be described, as an example.

Figure 9A:
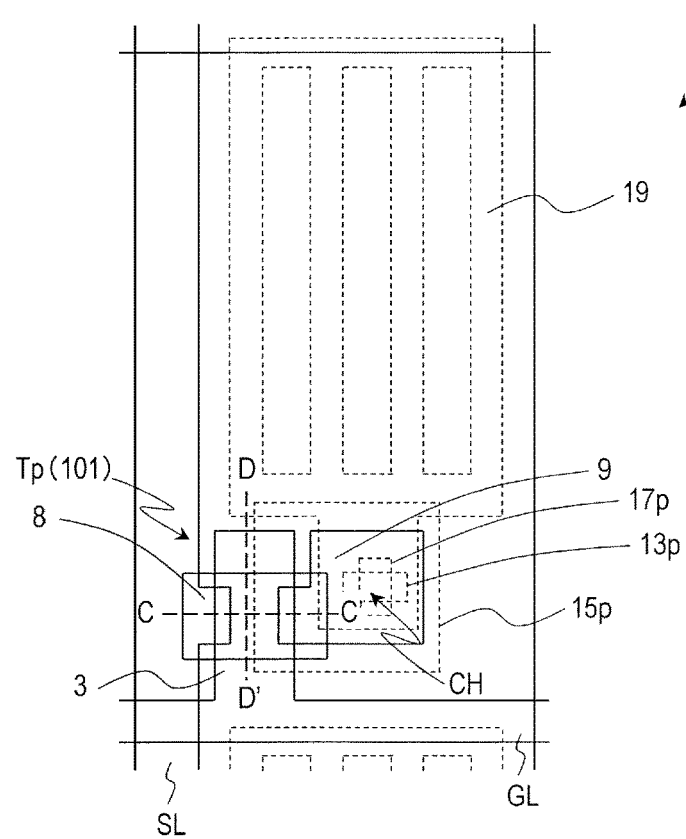
FIG. 9A is a plan view showing one pixel region P of the active matrix substrate 1000.
Figure 9B:
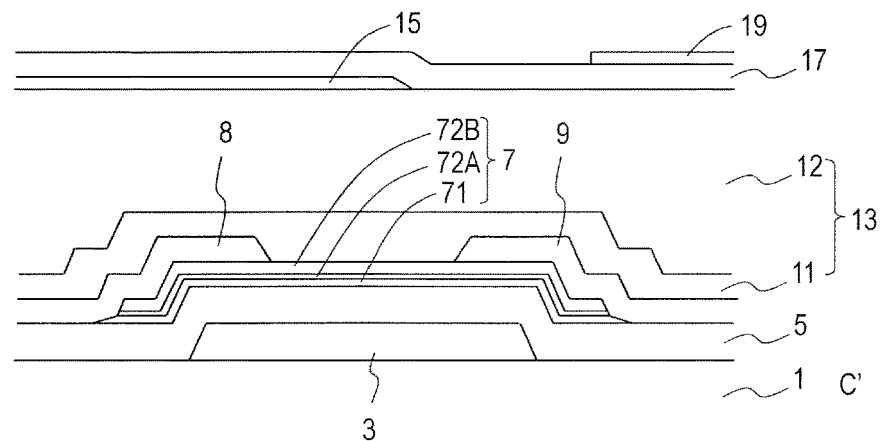
FIGS. 9B and 9C are cross-sectional views taken along line C-C' and line D-D', respectively.
Figure 9C:
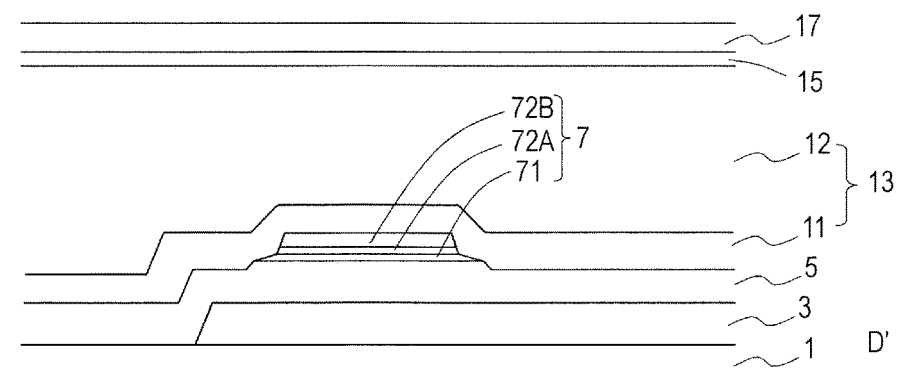

FIG. 9A is a plan view showing one pixel region P of the active matrix substrate 1000, and FIGS. 9B and 9C are cross-sectional views taken along line C-C' and line D-D' of FIG. 9A.

The pixel region P is a region that is surrounded by source bus lines SL and gate bus lines GL that extend in the direction crossing the source bus lines SL. The pixel region P includes the substrate 1, a thin film transistor (pixel TFT) Tp supported on the substrate 1, a lower transparent electrode 15, and an upper transparent electrode 19. In this example, the lower transparent electrode 15 is the common electrode CE, and the upper transparent electrode is the pixel electrode PE. Note that the lower transparent electrode 15 may be the pixel electrode PE, and the upper transparent electrode 19 may be the common electrode CE.

The TFT 101 shown in FIGS. 1A to 1C or a TFT 102 to be described later can be used as the thin film transistor Tp.

The gate electrode 3 of the thin film transistor Tp is connected to the corresponding gate bus line GL, and the source electrode 8 is connected to the corresponding source bus line SL. The drain electrode 9 is electrically connected to the pixel electrode PE. The gate electrode 3 and the gate bus line GL may be formed integrally using the same conductive film. The source electrode 8, the drain electrode 9 and the source bus line SL may be formed integrally using the same conductive film.

Although there is no particular limitation, an interlayer insulating layer 13 may include an inorganic insulating layer (passivation film) 11, and an organic insulating layer 12 arranged on the inorganic insulating layer 11, for example. Note that the interlayer insulating layer 13 does not need to include an organic insulating layer.

The pixel electrode PE and the common electrode CE are arranged so as to overlap with each other with a dielectric layer 17 interposed therebetween. The pixel electrode PE is divided into portions corresponding to pixels. The common electrode CE does not need to be divided into portions corresponding to pixels. In this example, the common electrode CE is formed on the interlayer insulating layer 13. The pixel electrode PE is formed on the dielectric layer 17, and electrically connected to the drain electrode 9 through a contact hole CH provided in the interlayer insulating layer 13 and the dielectric layer 17. In this example, a portion where an opening 13p of the interlayer insulating layer 13 and an opening 17p of the dielectric layer 17 overlap with each other serves as the contact hole CH. Although not shown in the figures, the pixel electrode PE has at least one slit or a cut-out for each pixel. The common electrode CE has an opening 15p in a region where the contact hole CH is formed. The common electrode CE may extend entirely over the pixel region P excluding this region.

The pixel electrode PE and the common electrode CE may each be formed from an ITO (indium-tin oxide) film, an In—Zn—O-based semiconductor (indium-zinc oxide) film, a ZnO film (zinc oxide film), or the like, for example. The thicknesses of the pixel electrode PE and the common electrode CE may each be 50 nm or more and 200 nm or less, for example. The dielectric layer 17 may be a silicon nitride (SiNx) film, a silicon oxide (SiOx) film, a silicon oxide nitride (SiOxNy; x>y) film, a silicon nitride oxide (SiNxOy; x>y) film, or the like, for example. The thickness of the dielectric layer 17 may be 70 nm or more and 300 nm or less, for example.

The active matrix substrate 1000 can be applicable to a display device of an FFS mode, for example. The FFS mode is a transverse electric field mode in which a pair of electrodes (the pixel electrode PE and the common electrode CE) are provided on one substrate, and an electric field is applied through the liquid crystal molecules in the direction (transverse direction) parallel to the substrate surface.

An electrode structure in which the pixel electrode PE is arranged on the common electrode CE with the dielectric layer 17 interposed therebetween is described in International Publication WO2012/086513 pamphlet, for example. An electrode structure in which the common electrode CE is arranged on the pixel electrode PE with the dielectric layer 17 interposed therebetween is described in Japanese Laid-Open Patent Publication No. 2008-032899 and Japanese Laid-Open Patent Publication No. 2010-008758. The disclosures of International Publication WO2012/086513 pamphlet, Japanese Laid-Open Patent Publication No. 2008-032899 and Japanese Laid-Open Patent Publication No. 2010-008758 are herein incorporated by reference in their entirety.

Second Embodiment

A semiconductor device of a second embodiment includes a top gate structure TFT in which the gate electrode is arranged on the opposite side of the semiconductor layer away from the substrate.

Figure 10:
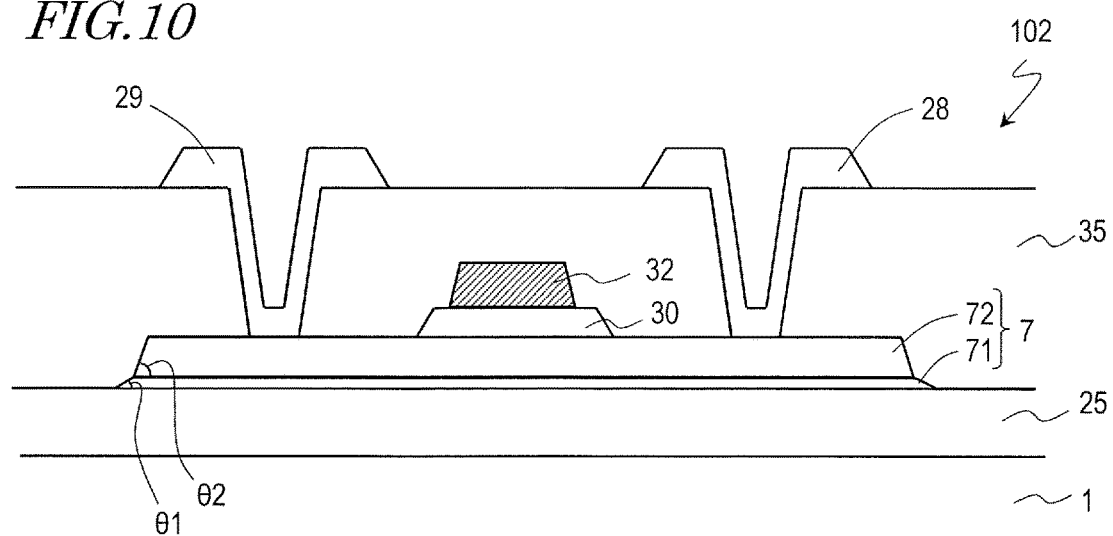
FIG. 10 is a schematic cross-sectional view showing a TFT 102 of a second embodiment.

FIG. 10 is a cross-sectional view showing the TFT 102 of the present embodiment.

The TFT 102 includes the semiconductor layer 7, a gate insulating layer 30, a gate electrode 32, a source electrode 28 and a drain electrode 29.

The semiconductor layer 7 is formed on the substrate 1. The semiconductor layer 7 may be arranged on a lower insulating layer 25 formed on the substrate 1.

The semiconductor layer 7 has a similar layered structure to that of the semiconductor layer 7 described in the embodiment described above. That is, the semiconductor layer 7 includes the lower oxide semiconductor layer 71, and the upper oxide semiconductor layer 72 arranged on the lower oxide semiconductor layer 71. The side surface slope angle θ1 of the lower oxide semiconductor layer 71 is smaller than the side surface slope angle θ2 of the upper oxide semiconductor layer 72. The semiconductor layer 7 can be formed by a similar method to that for the semiconductor layer 7 of the embodiment described above. The upper oxide semiconductor layer 72 may be in contact with the gate insulating layer 30.

In the present embodiment, preferably, the thickness of the upper oxide semiconductor layer 72 is 5 nm or more and less than 15 nm. More preferably, it is 5 nm or more and 10 nm or less. If 5 nm or more, it is possible to increase the ON current. If less than 15 nm, it is possible to suppress lowering of the mobility of electrons flowing through the upper oxide semiconductor layer 72.

Note that as opposed to the embodiment described above, the thickness of the upper oxide semiconductor layer may be greater than the thickness of the lower oxide semiconductor layer 71 or may be less than or equal to the thickness of the lower oxide semiconductor layer 71. The thickness of the lower oxide semiconductor layer 71, and the compositions of the lower oxide semiconductor layer 71 and the upper oxide semiconductor layer 72 may be similar to those of the embodiment described above.

The gate insulating layer 30 is provided on a portion of the semiconductor layer 7. The gate insulating layer 30 may be formed in an island-like shape only in a region that overlaps with the gate electrode 32. The gate electrode 32 is provided on the gate insulating layer 30. The gate electrode 32 opposes the semiconductor layer 7 with the gate insulating layer 30 interposed therebetween.

The semiconductor layer 7, the gate insulating layer 30 and the gate electrode 32 are covered by an interlayer insulating layer 35. The source electrode 28 and the drain electrode 29 are arranged on the interlayer insulating layer 35, and are connected to the semiconductor layer 7 through the contact hole formed in the interlayer insulating layer 35.

Also in the present embodiment, it is possible to make the taper angle T of the semiconductor layer 7 small, and it is therefore possible to improve the coverage of the interlayer insulating layer 35. Therefore, it is possible to suppress TFT characteristics deterioration due to moisture, etc., entering the semiconductor layer 7 (particularly, the lower oxide semiconductor layer 71).

<Method for Manufacturing TFT 102>

The TFT 102 can be formed as follows, for example. First, the semiconductor layer 7 is formed on an insulating layer (e.g., an $SiO_2$ layer) 25 by a method similar to that for the semiconductor layer 7 of the TFT 101.

Next, a gate insulating film and an upper gate conductive film are formed so as to cover the semiconductor layer 7. A silicon oxide ($SiO_2$) layer, a silicon nitride (SiNx) layer, a silicon oxide nitride (SiOxNy; x>y) layer, a silicon nitride oxide (SiNxOy; x>y) layer, an aluminum oxide layer or a tantalum oxide layer, etc., can suitably be used as the gate insulating film. Herein, a silicon oxide (SiOx) layer (thickness: 80 nm or more and 250 nm or less, e.g., 150 nm) is formed as the gate insulating film by using a CVD method. A conductive film similar to that of the gate electrode 3 of the TFT 101 may be used as the upper gate conductive film. Herein, as the upper gate conductive film, a layered film including a Ti film as the lower layer and a Cu film as the upper layer is formed by a sputtering method.

Next, the upper gate conductive film and the gate insulating film are etched, thereby obtaining the gate electrode 32 and the gate insulating layer 30. Herein, a resist mask is formed on the upper gate conductive film, and the upper gate conductive film and the gate insulating film are etched (herein, dry-etched) at the same time using the resist mask. Therefore, a portion of the gate insulating film that is not covered by the gate electrode 32 is removed.

Then, a plasma treatment may be performed over the entire surface of the substrate 1 from above the gate electrode 32. The plasma treatment lowers the resistance of only a region of the semiconductor layer 7 that is not covered by the gate electrode 32.

Then, the interlayer insulating layer 35 (thickness: 100 nm or more and 500 nm or less, for example) is formed so as to cover the semiconductor layer 7, the gate insulating layer 30 and the gate electrode 32. As the interlayer insulating layer 35, a silicon oxide film, a silicon nitride film, a silicon oxide nitride film and a silicon nitride oxide film may be formed in a single layer or as a layered structure. Herein, as the interlayer insulating layer 35, an SiNx (thickness: 100 nm) and an $SiO_2$ film (thickness: 300 nm) are formed consecutively by a CVD method.

Note that after the gate electrode 32 and the gate insulating layer 30 are patterned, an insulating film (e.g., a nitride film such as SiNx) that reduces an oxide semiconductor may be formed so as to be in contact with a portion of the upper surface of the semiconductor layer 7 that is exposed through the gate electrode 32. Then, the exposed portion of the semiconductor layer 7 is reduced to lower the resistance thereof (self-alignment structure). In such a case, the plasma treatment described above does not need to be performed.

Then, a contact hole is formed in the interlayer insulating layer 35 that exposes a portion of the semiconductor layer 7. Then, a source line conductive film is formed on the interlayer insulating layer 35 and in the contact hole. Herein, a source line conductive film (a layered film including a Ti film as the lower layer and an Al film as the upper layer) similar to the TFT 101 is used. Next, the source line conductive film is patterned, thereby obtaining the source electrode 28 and the drain electrode 29. Thus, the TFT 102 is manufactured.

<Variation>

Figure 11:
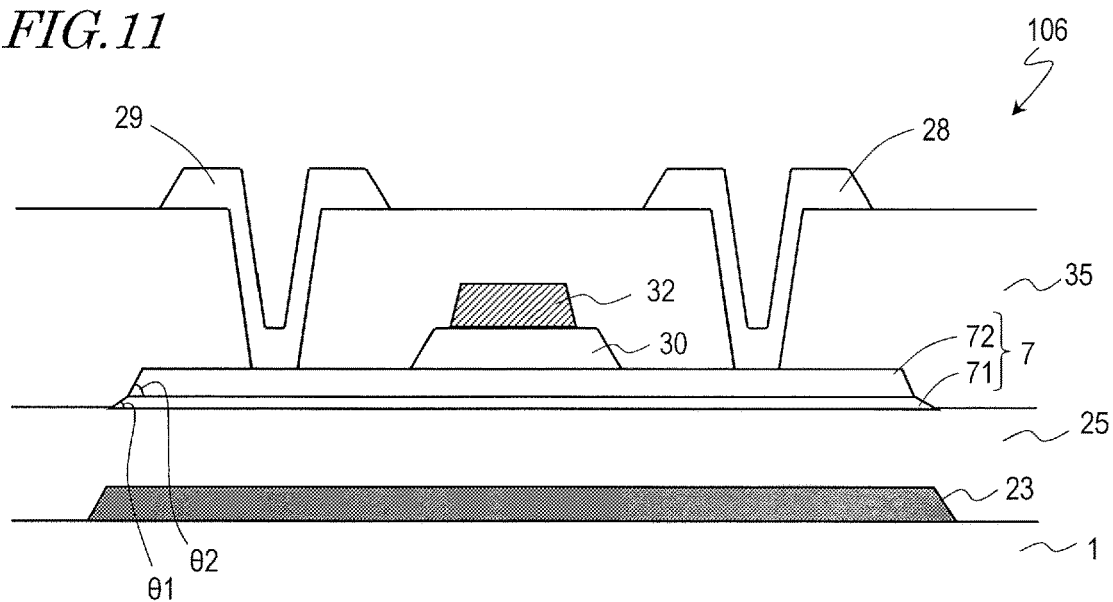
FIG. 11 is a schematic cross-sectional view showing another TFT 103 of the second embodiment.

FIG. 11 is a cross-sectional view illustrating another TFT 106 of the present embodiment.

The TFT 106 is different from the TFT 102 shown in FIG. 10 in that the TFT 106 has a dual gate structure in which a lower electrode 23 is arranged between the substrate 1 and the lower insulating layer 25.

The lower electrode 23 is arranged so as to overlap at least with the channel region 7c as seen from the direction normal to the substrate 1. The lower electrode 23 may be a metal layer. Then, the lower electrode 23 can function also as a light blocking layer of the TFT 106. For example, the lower electrode 23 may be formed from the same conductive film as the gate bus line GL (FIGS. 1A to 1C).

The lower electrode 23 may be grounded. Then, it is possible to ensure the stability of the characteristics of the TFT 106. The lower electrode 23 may be electrically connected to the source electrode 28. Alternatively, the lower electrode 23 may be electrically connected to the gate electrode 32 (or the gate bus line) so as to be at the same potential as the gate electrode 32. Since the semiconductor layer 7 has the lower oxide semiconductor layer 71 to be the carrier transfer layer on the substrate 1 side, it is possible to more effectively improve the ON current if the lower electrode 23 functioning as the gate electrode is provided also on the substrate 1 side of the semiconductor layer 7.

(Regarding TFT Structure and Oxide Semiconductor)

The TFT structure is not limited to the structure illustrated in the first to third embodiments. For example, although the TFT 101 shown in FIGS. 1A to 1C has a top contact structure in which the source and drain electrodes are in contact with the upper surface of the semiconductor layer, it may have a bottom contact structure in which the source and drain electrodes are in contact with the lower surface of the semiconductor layer. Moreover, the configurations of the top gate structure TFT and the bottom gate structure TFT are not limited to those described above.

In the embodiment described above, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, and a crystalline oxide semiconductor whose c-axis is oriented generally perpendicular to the layer surface.

The oxide semiconductor layer may have a layered structure including an amorphous oxide semiconductor layer and a crystalline oxide semiconductor layer. Alternatively, it may include a plurality of crystalline oxides having different crystalline structures.

The material, the structure, the film formation method of the amorphous oxide semiconductor and each of the crystalline oxide semiconductors, and the configuration of an oxide semiconductor layer having a layered structure, etc., are described in Japanese Laid-Open Patent Publication No. 2014-007399, for example. The disclosure of Japanese Laid-Open Patent Publication No. 2014-007399 is herein incorporated by reference in its entirety.

The upper oxide semiconductor layer 72 of the semiconductor layer 7 includes In, Ga and Zn. The upper oxide semiconductor layer 72 includes an In—Ga—Zn—O-based semiconductor (e.g., indium gallium zinc oxide), for example. Herein, an In—Ga—Zn—O-based semiconductor is a ternary oxide of In (indium), Ga (gallium) and Zn (zinc), and there is no particular limitation on the ratio (composition ratio) between In, Ga and Zn, examples of which include In:Ga:Zn=2:2:1, In:Ga:Zn=1:1:1, In:Ga:Zn=1:1:2 and 1:3:6, for example. Such an oxide semiconductor layer can be formed from an oxide semiconductor film including an In—Ga—Zn—O-based semiconductor.

An In—Ga—Zn—O-based semiconductor may be amorphous or crystalline. A crystalline In—Ga—Zn—O-based semiconductor is preferably a crystalline In—Ga—Zn—O-based semiconductor whose c-axis is oriented generally perpendicular to the layer surface.

Note that crystalline structures of crystalline In—Ga—Zn—O-based semiconductors are disclosed in, for example, Japanese Laid-Open Patent Publication No. 2014-007399, supra, Japanese Laid-Open Patent Publication No. 2012-134475, Japanese Laid-Open Patent Publication No. 2014-209727, etc. The disclosures of Japanese Laid-Open Patent Publication No. 2012-134475 and Japanese Laid-Open Patent Publication No. 2014-209727 are herein incorporated by reference in their entirety. Since TFTs including an In—Ga—Zn—O-based semiconductor layer have a high mobility (more than 20 times that of an a-SiTFT) and a low leak current (less than 1/100 that of an a-SiTFT), they can desirably be used as driver TFTs (e.g., TFTs included in driver circuits provided around the display region including a plurality of pixels and on the same substrate as the display region) and pixel TFTs (TFTs provided in pixels).

The embodiment described above is suitably applicable to an active matrix substrate using oxide semiconductor TFTs. Active matrix substrates can be used in various display devices such as liquid crystal display devices, organic EL display devices and inorganic EL display devices, and electronic devices including display devices, etc. On an active matrix substrate, oxide semiconductor TFTs can be used not only as switching elements provided in pixels but also as circuit elements of peripheral circuits such as drivers (monolithicization). In such a case, oxide semiconductor TFTs of the present invention, which use an oxide semiconductor layer having a high mobility (e.g., 10 $cm^2$/Vs or more) as the active layer, can suitably be used as circuit elements.

The embodiments of the present invention are widely applicable to various semiconductor devices including oxide semiconductor TFTs. For example, they are applicable to circuit boards such as active matrix substrates, display devices such as liquid crystal display devices, organic electroluminescence (EL) display devices, inorganic electroluminescent display devices and MEMS display devices, image pickup devices such as image sensor devices, and various electronic devices such as image input devices, fingerprint reader devices and semiconductor memory devices.

This application is based on Japanese Patent Application No. 2018-040615 filed on Mar. 7, 2018, the entire contents of which are hereby incorporated by reference.

What is claimed is:

1. A semiconductor device comprising:
    a substrate;
    a thin film transistor supported on the substrate, the thin film transistor including a semiconductor layer, a gate electrode, a gate insulating layer between the gate electrode and the semiconductor layer, and a source electrode and a drain electrode electrically connected to the semiconductor layer; and
    an insulating layer covering the semiconductor layer or the thin film transistor, wherein:
    the semiconductor layer has a layered structure including:
        a lower oxide semiconductor layer including In, Ga, Zn and Sn; and
        an upper oxide semiconductor layer arranged on the lower oxide semiconductor layer and including In, Ga and Zn;
    a thickness of the lower oxide semiconductor layer is 5 nm or more and 20 nm or less;
    an atomic ratio of Sn with respect to all metal elements included in the lower oxide semiconductor layer is 5% or more;
    an atomic ratio of Sn with respect to all metal elements included in the upper oxide semiconductor layer is smaller than the atomic ratio of Sn with respect to the all metal elements included in the lower oxide semiconductor layer; and
    a first slope between a side surface and a lower surface of the lower oxide semiconductor layer is smaller than a second slope between a side surface and a lower surface of the upper oxide semiconductor layer,
    the lower oxide semiconductor film primarily includes a quaternary oxide of an In—Ga—Zn—Sn—O-based semiconductor,
    the upper oxide semiconductor layer primarily includes a ternary oxide of an In—Ga—Zn—O-based semiconductor, and
    as seen from a direction normal to the substrate, the semiconductor layer includes a source contact region electrically connected with the source electrode and a drain contact region electrically connected with the drain electrode, the upper oxide semiconductor layer being continuous between the source contact region and the drain contact region.

2. The semiconductor device according to claim 1, wherein the thickness of the lower oxide semiconductor layer is smaller than a thickness of the upper oxide semiconductor layer.

3. The semiconductor device according to claim 1, wherein the upper oxide semiconductor layer includes a plurality of layers having different composition ratios.

4. The semiconductor device according to claim 1, wherein the gate electrode is arranged on a substrate side of the semiconductor layer, with the gate insulating layer interposed therebetween.

5. The semiconductor device according to claim 1, wherein the gate electrode is arranged on an opposite side of the semiconductor layer away from the substrate, with the gate insulating layer interposed therebetween.

6. The semiconductor device according to claim 4, wherein the source electrode and the drain electrode have a layered structure including a molybdenum layer and a copper layer arranged on the molybdenum layer, wherein the molybdenum layer is in contact with an upper surface of the gate insulating layer and an upper layer of the semiconductor layer.

7. The semiconductor device according to claim 1, wherein the upper oxide semiconductor layer includes a crystalline portion.

* * * * *